United States Patent
Harashima et al.

(10) Patent No.: US 11,743,987 B2
(45) Date of Patent: Aug. 29, 2023

(54) ELECTRONIC DEVICE AND USB DEVICE

(71) Applicant: Kioxia Corporation, Tokyo (JP)

(72) Inventors: Shiro Harashima, Kanagawa (JP); Kazumichi Hada, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/682,752

(22) Filed: Feb. 28, 2022

(65) Prior Publication Data

US 2022/0418067 A1 Dec. 29, 2022

(30) Foreign Application Priority Data

Jun. 25, 2021 (JP) .................. 2021-105728

(51) Int. Cl.
*G11C 16/06* (2006.01)
*G06F 1/26* (2006.01)
*H05B 45/30* (2020.01)
*G11C 16/04* (2006.01)

(52) U.S. Cl.
CPC ......... *H05B 45/30* (2020.01); *G11C 16/0483* (2013.01); *G11C 16/06* (2013.01)

(58) Field of Classification Search
CPC ........ H05B 45/00; H05B 45/10; H05B 45/30; H05B 45/14; H05B 45/48; G11C 16/06; G11C 16/0483; G11C 16/045; G11C 7/08; G11C 7/10; G06F 1/26; G06F 1/266; G06F 2213/0042
See application file for complete search history.

(56) References Cited

U.S. PATENT DOCUMENTS

| | | | |
|---|---|---|---|
| 9,544,958 B2 | 1/2017 | Ohki | |
| 10,681,786 B2 | 6/2020 | Luo et al. | |
| 2006/0043911 A1* | 3/2006 | Shao | H05B 45/38 315/291 |
| 2008/0246064 A1* | 10/2008 | Kimura | H04N 3/155 348/E3.018 |
| 2009/0224676 A1* | 9/2009 | Osame | G09G 3/3258 315/121 |
| 2013/0175951 A1 | 7/2013 | Wu | |
| 2021/0144821 A1* | 5/2021 | Sekido | G03B 15/05 |
| 2021/0368599 A1* | 11/2021 | Lutzmayr | H05B 45/37 |

FOREIGN PATENT DOCUMENTS

JP 2011-228584 A 11/2011
TW M583608 U 9/2019

* cited by examiner

*Primary Examiner* — Thai Pham
(74) *Attorney, Agent, or Firm* — Foley & Lardner LLP

(57) ABSTRACT

An electronic device includes a light-emitting element whose one end is connected to a first voltage source. A control circuit is connected between the other end of the light-emitting element and a host computer and controls the light-emitting element in accordance with a signal from the host computer. A resistance element is connected between a first connecting portion, which is located between the light-emitting element and the control circuit, and a reference potential source.

18 Claims, 2 Drawing Sheets

ELECTRONIC DEVICE AND USB DEVICE

CROSS-REFERENCE TO RELATED APPLICATION(S)

This application is based upon and claims the benefit of priority from Japanese Patent Application No. 2021-105728, filed Jun. 25, 2021, the entire contents of which are incorporated herein by reference.

FIELD

Embodiments described herein relate generally to an electronic device and a USB device.

BACKGROUND

An electronic device such as a universal serial bus (USB) memory may be connected to an external host computer such as a central processing unit (CPU) in such a way that the electronic device can communicate with the host computer via an interface. The electronic device sometimes includes a light-emitting diode (LED) to inform a user of access from the host computer.

However, with a change in standards for electronic devices, a power supply voltage of a control circuit of an LED also gradually decreases. Consequently, there is danger that leakage current leaking from the LED when the LED is out will flow back to the control circuit and damage the control circuit.

DETAILED DESCRIPTION

Embodiments provide an electronic device and a USB device that can protect a control circuit from a current from a light-emitting element even when a power supply voltage decreases.

In general, according to at least one embodiment, an electronic device includes a light-emitting element whose one end is connected to a first voltage source. A control circuit is connected between the other end of the light-emitting element and a host computer and controls the light-emitting element in accordance with a signal from the host computer. A resistance element is connected between a first connecting portion, which is located between the light-emitting element and the control circuit, and a reference potential source.

Hereinafter, at least one embodiment according to the present disclosure will be described with reference to the drawings. The at least one embodiment is not intended as being limited. The drawings are schematic or conceptual drawings and the ratio between the portions, for example, is not always identical to the actual ratio. In the specification and drawings, any element which is similar to that described in connection with the already explained drawing is denoted by the same reference sign and detailed explanations thereof will be omitted as appropriate.

Figure 1:
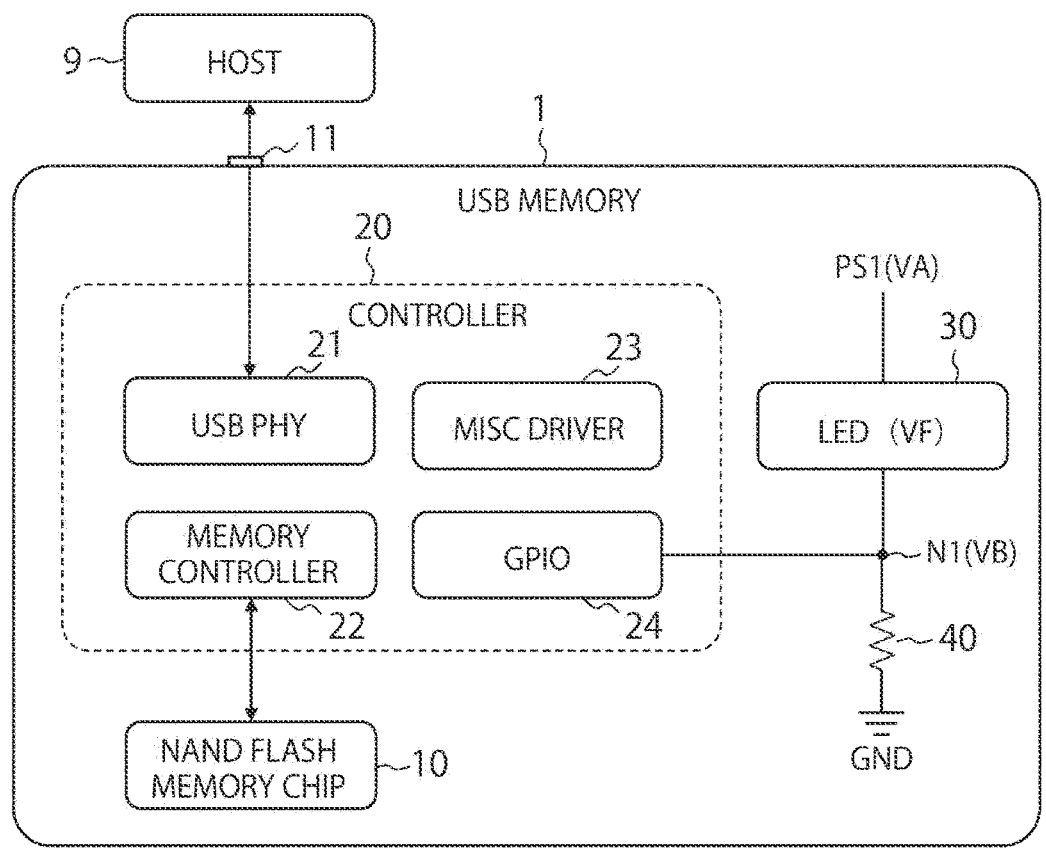
FIG. 1 is a diagram showing a configuration example of a USB memory according to at least one embodiment.

FIG. 1 is a diagram showing a configuration example of a USB memory 1 according to the at least one embodiment. The USB memory 1 is connected to a host computer 9 in such a way that the USB memory 1 can communicate with the host computer 9 via a USB interface 11. The host computer 9 is provided outside the USB memory 1 and can make access to a memory 10 in the USB memory 1 and read data from the memory 10 or write data into the memory 10. The host computer 9 may be, for example, an operation portion (CPU) provided in a computer. In the present specification, at least one embodiment of a USB memory is described as an electronic device; an electronic device may be other USB devices.

The USB memory 1 includes the memory 10, a controller 20, an LED 30, a resistance element 40, and the USB interface 11. The memory 10 and the controller 20 are formed on different semiconductor chips. The LED 30 and the resistance element 40 are configured with different packages as electronic parts. In a housing, the memory 10, the controller 20, the LED 30, and the resistance element 40 are mounted on one wiring substrate (not shown in the drawing).

The memory 10 is a nonvolatile memory that is connected to the controller 20 and transmits and receives data to and from the host computer 9. The memory 10 is NAND flash memory, for example, and may be a two-dimensional memory cell array in which memory cells are two-dimensionally arranged in a matrix or a three-dimensional memory cell array in which memory cells are arranged three-dimensionally. The memory 10 is connected to the external host computer 9 via the controller 20 and can store data or output data in accordance with a command from the host computer 9.

The LED 30 as a light-emitting element is connected between the controller 20 and a voltage source PS1. The anode of the LED 30 is connected to the voltage source PS1 and supplied with a high-level voltage VA from the voltage source PS1. The cathode of the LED 30 is connected to a connecting portion N1. By being supplied with power from the voltage source PS1, the LED 30 emits light of a predetermined wavelength (predetermined color).

The resistance element 40 is connected between the connecting portion N1 and a ground GND. The resistance element 40 is provided in order to bypass at least part of a leakage current from the LED 30 and allow the leakage current to escape to the ground GND when the LED 30 is in an OFF state.

The controller 20 includes a USB physical layer device 21, a memory controller 22, a MISC 23, and a general-purpose input/output (GPIO) circuit 24.

The USB physical layer device 21 is a circuit for implementing the function of a physical layer in the Open Systems Interconnection (OSI) layer model. The memory controller 22 is a control circuit that controls the memory 10. The MISC 23 is the other control circuit. The GPIO circuit 24 is a general-purpose input/output interface circuit connecting to the host computer 9 and is connected to a node N1 between the LED 30 and the resistance element 40.

Figure 2:
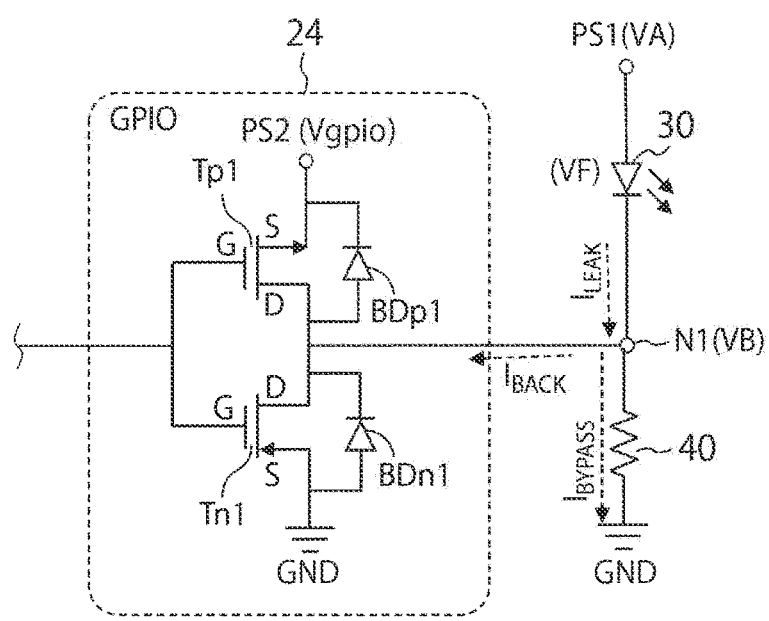
FIG. 2 is a circuit diagram showing a GPIO circuit and a peripheral circuit thereof.

FIG. 2 is a circuit diagram showing the GPIO circuit 24 and a peripheral circuit thereof. The GPIO circuit 24 is connected between the cathode of the LED 30 and the host computer 9 and controls the emission of light from the LED 30 in accordance with a signal from the host computer 9. The GPIO circuit 24 includes a P-type transistor (a P-type MOSFET) Tp1 and an N-type transistor (an N-type MOSFET) Tn1. The P-type transistor Tp1 and the N-type transistor Tn1 are connected in series between a voltage source PS2 and the ground GND. A voltage Vgpio of the voltage source PS2 is a power supply voltage lower than the voltage of the voltage source PS1. For example, the voltage VA of the voltage source PS1 is about 3.3 V and the voltage Vgpio of the voltage source PS2 is about 1.2 V.

When a connecting portion between the LED 30 and the GPIO circuit 24 is assumed to be N1, the source of the transistor Tp1 is connected to the voltage source PS2 and the drain of the transistor Tp1 is connected to the connecting portion N1. Moreover, the drain of the transistor Tn1 is connected to the connecting portion N1 and the source of the transistor Tn1 is connected to the ground GND. The connecting portion N1 is electrically connected between the transistor Tp1 and the transistor Tn1.

The gates of the transistors Tp1 and Tn1 are common-connected to the host computer 9 or the memory 10 and receive a control signal simultaneously from the host computer 9. Since the transistors Tp1 and Tn1 are transistors of different conductivity types, the transistors Tp1 and Tn1 perform on/off operations in a complementary manner when receiving the same control signal. The control signal may be a digital signal that maintains high level when the LED is out and maintains low level when the LED is on. For example, when the host computer 9 makes access to the memory 10 and transmits and receives data to and from the memory 10, the control signal becomes high level. This makes the transistor Tp1 enter an OFF state (a non-conductive state) and makes the transistor Tn1 enter an ON state (a conductive state); thus, the connecting portion N1 is connected to the ground GND via the transistor Tn1, which causes a current to flow through the LED 30 from the voltage source PS1 and flow into the ground GND via the node N1 and the transistor Tn1, whereby the LED 30 is turned on. On the other hand, when the host computer 9 does not make access to the memory 10 and does not transmit and receive data to and from the memory 10, the control signal becomes low level. This makes the transistor Tp1 enter an ON state (a conductive state) and makes the transistor Tn1 enter an OFF state (a non-conductive state); thus, the connecting portion N1 is connected to the voltage source PS2 via the transistor Tp1, which makes a voltage that is applied to the LED 30 relatively low, whereby the LED 30 is turned out.

The transistors Tp1 and Tn1 include body diodes BDp1 and BDn1, respectively, between the source and the drain. The body diodes BDp1 and BDn1 are each a parasitic diode provided at a PN junction between a semiconductor substrate (not shown in the drawing) of the GPIO circuit 24 and a source layer or a drain layer. The anode of the body diode BDp1 is located on the drain side of the P-type transistor Tp1 and the cathode of the body diode BDp1 is located on the source side of the P-type transistor Tp1. The anode of the body diode BDn1 is located on the source side of the N-type transistor Tn1 and the cathode of the body diode BDn1 is located on the drain side of the N-type transistor Tn1.

The resistance element 40 is connected between the connecting portion N1 and the ground GND. The resistance element 40 is provided in order to bypass at least part $I_{BYPASS}$ of a leakage current $I_{LEAK}$ from the LED 30 and allow it to escape to the ground GND when the LED 30 is in an OFF state. The resistance element 40 adjusts a voltage VB of the connecting portion N1 so as to be lower than the voltage Vgpio of the voltage source PS2 by allowing the part $I_{BYPASS}$ of the leakage current $I_{LEAK}$ to escape. That is, when the LED 30 is out, the voltage VB of the connecting portion N1 is lower than the voltage Vgpio of the voltage source PS2.

If the voltage VB of the connecting portion N1 is higher than the voltage Vgpio of the voltage source PS2 when the LED 30 is out, a forward bias voltage is applied to the body diode BDp1. When the forward bias voltage is applied to the body diode BDp1, much of the leakage current $I_{LEAK}$ from the LED 30 flows back to the voltage source PS2 as a current $I_{BACK}$ via the connecting portion N1 and the body diode BDp1. The voltage source PS2 is a voltage source which is supplied from the host computer 9; therefore, when much of the leakage current $I_{LEAK}$ flows back to the voltage source PS2, there is danger that the GPIO circuit 24 will break.

When the ohmic value of the resistance element 40 is too high, the current $I_{BYPASS}$ which is bypassed to the ground GND from the resistance element 40 is too small, which makes the voltage VB of the connecting portion N1 higher than the voltage Vgpio of the voltage source PS2. On the other hand, when the ohmic value of the resistance element 40 is too low, the current $I_{BYPASS}$ which is bypassed to the ground GND from the resistance element 40 is too large, which leaves the LED 30 turned on at all times. Therefore, the ohmic value of the resistance element has an appropriate range depending on, for example, the characteristics of the LED 30, the voltage VA of the voltage source PS1, and the voltage Vgpio of the voltage source PS2. For example, when a voltage VF which is applied to the LED 30 when the LED 30 is turned on is about 1.75 V, the voltage VA of the voltage source PS1 is about 3.3 V, and the voltage Vgpio of the voltage source PS2 is about 1.2 V, the ohmic value of the resistance element 40 is set in the range from about 500 ohm to about 1.5 kohm. This makes it possible to make the voltage VB of the connecting portion N1 lower than Vgpio (1.2 V) when the LED 30 is out (when the gate voltages of the transistors Tp1 and Tn1 are at low level). That is, when there is no access from the host computer 9, the voltage VB (VB=VA-VF) is lower than the voltage Vgpio. This results in the application of a reverse bias to the body diode BDp1 and the body diode BDp1 enters an open state. Consequently, the current $I_{BACK}$ does not flow back to the controller 20, which makes it possible for the GPIO circuit 24 according to at least one embodiment to protect itself when the LED 30 is out.

The ohmic value of the resistance element 40 may be nearly equal to the ohmic value of the LED 30 when the LED 30 is out (for example, the ohmic value of the resistance element 40 may range from about 500 ohm to about 1.5 kohm). This makes the current $I_{BYPASS}$ flowing when the LED 30 is out close or nearly equal to the leakage current $I_{LEAK}$, and, assuming that the current $I_{BYPASS}$ is, for example, approximately a few μA, the current $I_{BYPASS}$ has no adverse effects when the LED 30 is turned on.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. An electronic device comprising:
   a light-emitting element having one end connected to a first voltage source;
   a controller, connected between an other end of the light-emitting element and a host computer, and configured to control an emission of light from the light-emitting element based on a signal from the host computer; and
   a resistance element connected between a first connecting portion and a reference potential source, the first connecting portion located between the light-emitting element and the controller, wherein the resistance element is provided to bypass at least part of a leakage current from the light emitting element and allow the leakage current to escape to the ground when the light emitting element is in an OFF state.

2. The electronic device according to claim 1,
wherein the controller further comprising a general-purpose input/output (GPIO) circuit having a first transistor of a first conductivity type and a second transistor of a second conductivity type that are connected in series between a second voltage source and the reference potential source, wherein the second voltage source has a lower voltage than the first voltage source,
wherein the first connecting portion is electrically connected between the first transistor and the second transistor, and
wherein the electronic device is configured to provide a signal to gates of the first and second transistors.

3. The electronic device according to claim 2,
wherein, when the light-emitting element is out, a voltage of the first connecting portion is lower than the voltage of the second voltage source.

4. The electronic device according to claim 2,
wherein the light-emitting element includes an anode connected to the first voltage source,
wherein the light-emitting element includes a cathode connected to the first connecting portion,
wherein the first transistor is a P-type metal oxide semiconductor field-effect transistor (MOSFET), the first transistor includes a source connected to the second voltage source, and the first transistor includes a drain connected to the first connecting portion, and
wherein the second transistor is an N-type MOSFET, the second transistor includes a drain connected to the first connecting portion, and the second transistor includes a source connected to the reference potential source.

5. The electronic device according to claim 2, wherein the controller includes a first body diode electrically connecting a source and a drain of the first transistor, and includes a second body diode electrically connecting a source and a drain of the second transistor.

6. The electronic device according to claim 1,
wherein an ohmic value of the resistance element is at least 500 ohm and no more than 1.5 kohm.

7. The electronic device according to claim 1,
wherein the light-emitting element is a light-emitting diode (LED).

8. The electronic device according to claim 1, further comprising:
a nonvolatile memory, electrically connected to the controller, that is configured to transmit and receive data to and from the host computer.

9. The electronic device according to claim 8, wherein the controller further comprising a memory controller configured to control the nonvolatile memory.

10. A universal serial bus (USB) device comprising:
a light-emitting element having one end connected to a first voltage source;
a controller, connected between an other end of the light-emitting element and a host computer, and configured to control an emission of light from the light-emitting element based on a signal from the host computer; and
a resistance element connected between a first connecting portion and a reference potential source, the first connecting portion located between the light-emitting element and the controller, wherein the resistance element is provided to bypass at least part of a leakage current from the light emitting element and allow the leakage current to escape to the ground when the light emitting element is in an OFF state.

11. The USB device according to claim 10,
wherein the controller further comprising a general-purpose input/output (GPIO) circuit having a first transistor of a first conductivity type and a second transistor of a second conductivity type that are connected in series between a second voltage source and the reference potential source, wherein the second voltage source has a lower voltage than the first voltage source,
wherein the first connecting portion is electrically connected between the first transistor and the second transistor, and
wherein the electronic device is configured to input a signal to gates of the first and second transistors.

12. The USB device according to claim 11,
wherein, when the light-emitting element is out, the first connecting portion has a lower voltage than the second voltage source.

13. The USB device according to claim 11,
wherein the light-emitting element includes an anode connected to the first voltage source,
wherein the light-emitting element includes a cathode connected to the first connecting portion,
wherein the first transistor is a P-type metal oxide semiconductor field-effect transistor (MOSFET), the first transistor includes a source connected to the second voltage source, and the first transistor includes a drain connected to the first connecting portion, and
wherein the second transistor is an N-type MOSFET, the second transistor includes a drain connected to the first connecting portion, and the second transistor includes a source connected to the reference potential source.

14. The USB device according to claim 11, wherein the controller includes a first body diode electrically connecting a source and a drain of the first transistor, and includes a second body diode electrically connecting a source and a drain of the second transistor.

15. The USB device according to claim 10,
wherein an ohmic value of the resistance element is at least 500 ohm and no more than 1.5 kohm.

16. The USB device according to claim 10,
wherein the light-emitting element is a light-emitting diode (LED).

17. The USB device according to claim 10, further comprising:
a nonvolatile memory, electrically connected to the controller, that is configured to transmit and receive data to and from the host computer.

18. The USB device according to claim 17, further comprising a memory controller configured to control the nonvolatile memory.

* * * * *